US 6,534,871 B2

(12) United States Patent
Maa et al.

(10) Patent No.: US 6,534,871 B2
(45) Date of Patent: Mar. 18, 2003

(54) DEVICE INCLUDING AN EPITAXIAL NICKEL SILICIDE ON (100) SI OR STABLE NICKEL SILICIDE ON AMORPHOUS SI AND A METHOD OF FABRICATING THE SAME

(75) Inventors: Jer-shen Maa, Vancouver, WA (US); Douglas J. Tweet, Camas, WA (US); Yoshi Ono, Camas, WA (US); Fengyan Zhang, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/855,391

(22) Filed: May 14, 2001

(65) Prior Publication Data
US 2002/0168853 A1 Nov. 14, 2002

(51) Int. Cl.$^7$ .................. H01L 23/48; H01L 23/52; H01L 29/40
(52) U.S. Cl. .................. 257/769; 257/754; 257/757; 257/768
(58) Field of Search ................... 257/754, 757, 257/768, 769

(56) References Cited

U.S. PATENT DOCUMENTS

| 4,707,197 A | * | 11/1987 | Hensel et al. | 437/189 |
| 5,510,295 A | * | 4/1996 | Cabral, Jr. et al. | 437/200 |
| 6,323,130 B1 | * | 11/2001 | Brodsky et al. | 438/682 |

OTHER PUBLICATIONS

Mangelinck, D., Enhancement of Thermal Stability of NiSi films on (100)Si and (111)Si by Pt Addition, Appl. Phys. Lett. 75, 1736, 1999.

Van Meirhaeghe, R.L., Epitaxial CoSi$_2$ Formation by a Cr or Mo Interlayer, MRS Spring Conference Abstract. p. 81, 2000.

Ottaviani, G., NiSi Formation at the Silicide IS: Interface on the NiPt/Si System, J. Appl. Phys. 53, 4903, 1982.

Mukai, R. Compability of NiSi in the Self–Aligned Silicide Process for Deep Submicrometer Devices, Thin Solid Films, 270, 567, 1995.

Julies, B.A., A Study of the NiSi to NiSi$_2$ Transition in the Ni–Si Binary System, Thin Solid Films, 347, 201, 1999.

(List continued on next page.)

Primary Examiner—David L. Talbott
Assistant Examiner—David A. Zarneke
(74) Attorney, Agent, or Firm—David C. Ripma; Matthew D. Rabdau; Scott C. Krieger (57) ABSTRACT

An integrated circuit device, and a method of manufacturing the same, comprises an epitaxial nickel silicide on (100) Si, or a stable nickel silicide on amorphous Si, fabricated with a cobalt interlayer. In one embodiment the method comprises depositing a cobalt (Co) interface layer between the Ni and Si layers prior to the silicidation reaction. The cobalt interlayer regulates the flux of the Ni atoms through the cobalt/nickel/silicon alloy layer formed from the reaction of the cobalt interlayer with the nickel and the silicon so that the Ni atoms reach the Si interface at a similar rate, i.e., without any orientation preference, so as to form a uniform layer of nickel silicide. The nickel silicide may be annealed to form a uniform crystalline nickel disilicide. Accordingly, a single crystal nickel silicide on (100) Si or on amorphous Si is achieved wherein the nickel silicide has improved stability and may be utilized in ultra-shallow junction devices.

9 Claims, 7 Drawing Sheets

OTHER PUBLICATIONS

Lin, X.W., Integration of NiSi Salicide for Deep Submicron CMOS Technologies, Advanced Interconnects and Contact Materials and Processes for Future Integrated Circuits Symposium 179, 1998.

Poon, M.C., Thermal Stability of Cobalt and Nickel Silicides, Microelectronics Reliability 38, 1495, 1998.

Xu, D.X., Material Aspects of Nickel Silicide for ULSI Applications, Thin Solid Films, 326, 143, 1998.

Colgan, E.G., Nickel Silicide Thermal Stability on Polycrystalline and Single Crystalline Silicon, Materials Chemistry and Physics, 46, 209, 1996.

Chiu, K.C.R., Interface and Surface Structure of Epitaxial $NiSi_2$ films, Appl. Phys. Lett. 38, 988, 1981.

Sullivan, J.P., Control of Interfacial Morphology: $NiSi_2$ 1 Si(100), J. Appl. Phys. 72, 478, 1992.

Liu, J.F., Improvement of the Thermal Stability of NiSi Films by Using a thin Pt Interlayer, Appl. Phys. Lett. 77.14, 2177, 2000.

\* cited by examiner

Fig. 5 HRXRD OF 69Å Ni/14Å Co/Si AFTER 600°C 60s RTD

Fig. 6 HRXRD OF 69Å Ni/16Å Co/Si AFTER 700°C 60s RTD

Fig. 7 HRXRD OF 69Å Ni/16Å Co/Si AFTER 850°C 60s RTD

Fig. 8 (PRIOR ART) RTA of Ni on Si

Fig. 9 60 SEC RTA of 14Å Co/69Å Ni

Fig. 10 Ni-Co-Ni on Si

Fig. 11 (PRIOR ART) NICKEL SILICIDE ON a-Si

Fig. 12 Ni-Co-Ni ON a-Si

Fig. 13 NICKEL SILICIDE WITH Co ON a-Si

DEVICE INCLUDING AN EPITAXIAL NICKEL SILICIDE ON (100) SI OR STABLE NICKEL SILICIDE ON AMORPHOUS SI AND A METHOD OF FABRICATING THE SAME

FIELD OF THE INVENTION

This invention relates to high performance complementary metal oxide semiconductors (CMOS) and/or very short channel length, ultra shallow source/drain metal oxide semiconductor (MOS) transistors and, more particularly, to an integrated circuit device including an epitaxial nickel silicide on (100) Si or a stable nickel silicide on amorphous Si wherein cobalt is utilized as an interlayer in the fabrication of the silicide, and to a method of manufacturing the same.

BACKGROUND OF THE INVENTION

Titanium silicide and cobalt silicide are each currently being used in salicide manufacturing processes to produce metal oxide semiconductor (MOS) transistors. Titanium silicide has a disadvantage in that it is difficult to transform the silicide to a low resistivity C54 phase when the polysilicon line width is reduced. Cobalt silicide has the disadvantage of a high silicon (Si) consumption rate to form cobalt disilicide. Therefore, it is difficult to apply cobalt silicide directly on an ultra-shallow source/drain area. Moreover, a reduction in the junction depth requires a very flat interface between the silicide layer and the silicon active layer.

Nickel silicide is more suitable for ultra-shallow junction applications because nickel monosilicide (NiSi) consumes only 1.83 Angstoms (Å) of Si per Å of nickel (Ni) as compared with 3.64 Å of Si per Å of cobalt (Co) needed to form $CoSi_2$. Moreover, epitaxial silicide is the ideal material for shallow junctions because of the lack of any preturbation from individual grains, plus the advantages of higher thermal stability and lower resistivity and interfacial stress. However, NiSi is not stable at temperatures higher than 700° C. In particular, the NiSi further reacts with Si to convert to $NiSi_2$, and at higher temperatures agglomerates to isolate islands within the film. Because future advanced integrated circuit (IC) processes will involve high temperatures, it is important to establish a method to form a silicide on an ultra-shallow junction which will be stable at temperatures of about 800° C. or higher.

Adding platinum (Pt) to improve the thermal stability of nickel silicide has been discussed. However, it has been observed that electrically active defects in N-type Si were induced by the addition of Pt. The addition of Iridium (Ir) to a nickel silicide has been shown to improve the stability of the nickel silicide up to temperatures of 850° C. Moreover, good junction integrity in 40 nm ultra-shallow junctions was demonstrated. However, Iridium has not been used to fabricate epitaxial nickel disilicides because iridium is not easily etchable during a selective etch process.

Based on the disadvantages of these prior art silicides, there is a need for a method to form an epitaxial nickel disilicide on (100) Si. It is widely believed that epitaxial silicide will be desirable for use in future devices having very shallow junctions. Epitaxial silicide films in general have a very smooth silicide to Si interface. Due to the lack of grain boundaries, these films have high thermal stability and low resistivity.

Figure 1:
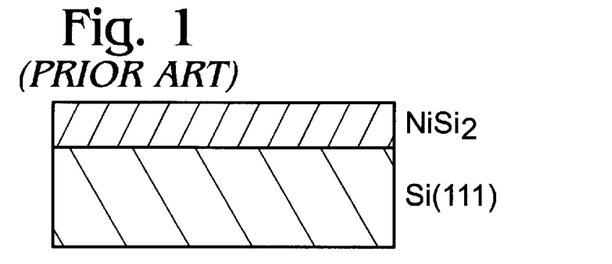
FIG. 1 is a schematic of a prior art single crystal nickel disilicide film grown on (111) silicon, having a smooth nickel-silicon interface.
Figure 2:
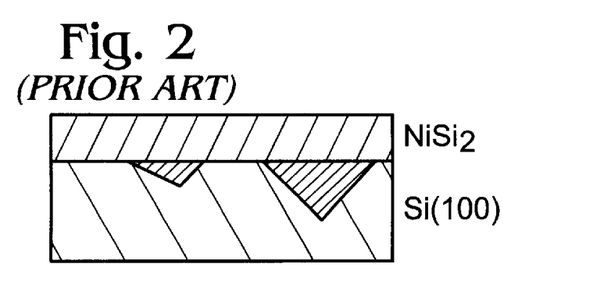
FIG. 2 is a schematic of a prior art single crystal nickel disilicide film grown on (100) silicon, showing faceting along the (111) plane.

The lattice mismatch between cobalt discilicide and Si is only −1.4%. The lattice mismatch between nickel disilicide and Si is only −0.4%. It is known that single crystal nickel disilicide can be formed on (111) Si by depositing Ni on Si and then annealing the films at a high temperature. The interface between the silicide and the (111) Si is very smooth, as shown in FIG. 1. However, when depositing nickel disilicide on (100) Si, it has been reported that serious faceting along the (111) plane is observed. A schematic of the interface of the silicide and the (100) Si is shown in FIG. 2.

A method to avoid the faceting problem in the epitaxial growth of $NiSi_2$ on (100) Si has been reported. The method requires the co-deposition of Ni and Si. Selective formation of the silicide, therefore, can not be achieved. Accordingly, it is difficult to implement this technique to small device fabrication processes.

Accordingly, there is a need for a method to form single-crystal $NiSi_2$ on (100) Si that is applicable to standard selective silicide processes for fabrication of devices having very small device features.

SUMMARY OF THE INVENTION

The present invention provides an integrated circuit device including an epitaxial nickel silicide on (100) Si, or a stable nickel silicide on amorphous Si, and a method of manufacturing the same. In particular, the method comprises depositing a cobalt (Co) interface layer between the Ni and Si layers prior to the silicidation reaction. The cobalt/nickel/ silicon alloy film formed from the reaction of the cobalt interlayer with the nickel and silicon regulates the flux of the Ni atoms through the interlayer so that the Ni atoms reach the Si interface at a similar rate, i.e., without any orientation preference, so as to form a uniform layer of nickel silicide. Accordingly, a single crystal nickel silicide on (100) Si or on amorphous Si is achieved wherein the nickel silicide has improved stability and may be utilized in ultra-shallow junction devices. Accordingly, an object of the present invention is to provide a single-crystal $NiSi_2$ on (100) Si without the formation of silicide faceting along the (111) plane into the Si substrate.

Another object of the present invention is to provide a nickel silicide fabrication process that is compatible with proposed future IC fabrication processes, allows selective formation of the silicide, and is inexpensive and simple to conduct.

Yet another object of the present invention is to provide a nickel silicide film for use in ultra-shallow junctions having a junction depth less than 40 nm, while maintaining the junction integrity and stability of the silicide layer at temperatures above 800° C., wherein cobalt is incorporated into the silicide layer.

DETAILED DESCRIPTION OF THE PREFERRED EMBODIMENTS

Referring now to the figures, FIG. 1 is a schematic of a prior art single crystal nickel disilicide film grown on (111) silicon, having a smooth interface.

FIG. 2 is a schematic of a prior art single crystal nickel disilicide film grown on (100) silicon, showing faceting along the (111) plane.

The present invention provides a method of fabricating epitaxial nickel disilicide ($NiSi_2$) having a smooth silicide/Si interface on amorphous or (100) Si. The invention comprises adding cobalt at the interface between the nickel (Ni) and the silicon (Si) before the silicidation reaction. In this manner, single crystal nickel silicide is achieved. The method provides for improved stability of the nickel silicide over prior art silicide films, and facilitates the fabrication of ultra-shallow junctions, i.e., junctions having a depth of 40 nm or less.

Applicants believe that the faceting at the silicide/silicon interface is controlled by kinetics, not thermodynamics. Therefore, Applicants believe that a smooth interface can be generated by regulating the diffusion of Ni atoms and the nucleation and growth of the $NiSi_2$ phase. In particular, the method of the present invention comprises adding an interlayer to regulate the flux of the Ni atoms therethrough. The interlayer facilitates the Ni atoms reaching the Si interface at a uniform rate and reacting with the Si at a uniform rate to form a uniform layer of nickel silicide. This is explained in FIGS. 3 and 4.

Figure 3:
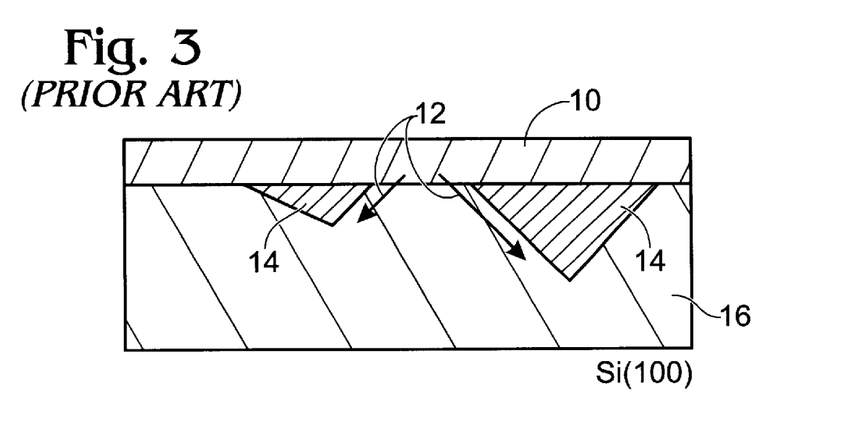
FIG. 3 is a schematic of nickel atoms of the prior art diffusing along the (111) plane of a silicon substrate, thereby causing facet formation.

FIG. 3 is a schematic of nickel atoms of the prior art diffused along the (111) plane of a silicon substrate, i.e., at an acute angle with respect to the planar surface of silicon substrate 16, thereby causing faceting formation. In particular, the nickel atoms 10 diffuse along the (111) plane 12 and cause the formation of faceting 14 in silicon substrate 16.

Figure 4:
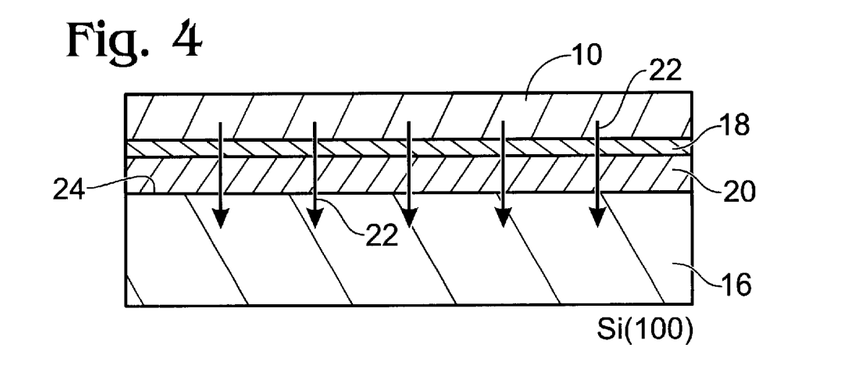
FIG. 4 is a schematic of nickel atoms diffusing through a cobalt/nickel/silicon alloy film formed from the reaction of the cobalt interlayer with nickel and silicon of the present invention on a (100) silicon substrate, thereby causing uniform growth of a single crystal nickel silicide on the silicon substrate.

FIG. 4 is a schematic of nickel atoms 10 diffusing through the interlayer 18 of the present invention on a (100) silicon substrate 16, thereby causing uniform growth of a single crystal nickel silicide 20 on the silicon substrate. The nickel atoms diffuse through the cobalt/nickel/silicon alloy film formed from the reaction of the cobalt interlayer with the nickel and the silicon, and reach the silicon interface without any preference, i.e, without any predetermined orientation. In other words, the nickel atoms diffuse in a direction 22 that is perpendicular to the planar surface 24 of silicon substrate 16. This causes the uniform growth of the single crystal nickel silicide 20. The fabrication steps to form the device shown in FIG. 4 will be described in more detail below.

In order to confirm the single crystal formation, Applicants performed high-resolution x-ray diffraction work on Co-doped nickel silicide films. The result showed the formation of very high quality single-crystal films, which were strained with respect to the single crystal Si substrate.

Figure 5:
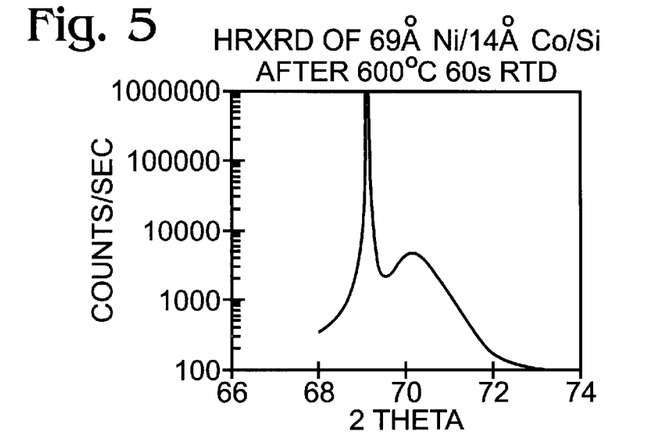
FIG. 5 shows a high resolution X-ray diffraction pattern of a nickel silicide film with cobalt addition after annealing at 600° C. for sixty seconds.

FIG. 5 shows a high resolution X-ray diffraction (HRXRD) pattern of a nickel silicide film with cobalt addition after annealing at 600° C. for sixty seconds. The ordinate represents counts/second and the abscissa represents 2Theta. The deposited film comprised a cobalt layer on the silicon substrate, wherein the thickness of the cobalt layer was approximately 14 Å. A nickel layer having a thickness of approximately 69 Å was deposited on the cobalt layer. These two layers were then subject to annealing at 600° C. for sixty seconds to form the nickel silicide film. As shown in the HRXRD pattern, a dislicide phase was formed at 600° C.

Figure 6:
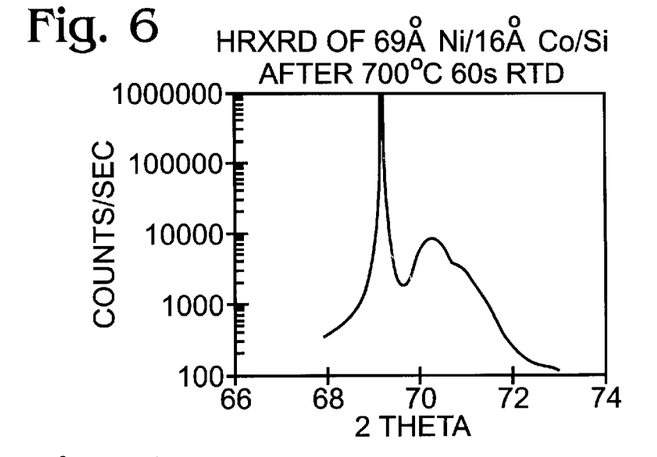
FIG. 6 shows a high resolution X-ray diffraction pattern of a nickel silicide film with cobalt addition after annealing at 700° C. for sixty seconds.

FIG. 6 shows a high resolution X-ray diffraction pattern of a nickel silicide film with cobalt addition after annealing at 700° C. for sixty seconds. The ordinate represents counts/second and the abscissa represents 2Theta. The deposited film comprised a cobalt layer on the silicon substrate, wherein the thickness of the cobalt layer was 16 Å. A nickel layer having a thickness of 69 Å was deposited on the cobalt layer. These two layers were then subject to annealing at 700° C. for sixty seconds to form the nickel silicide film. As shown in the HRXRD pattern, the nickel silicide film shows good film crystalline properties after annealing at 700° C.

Figure 7:
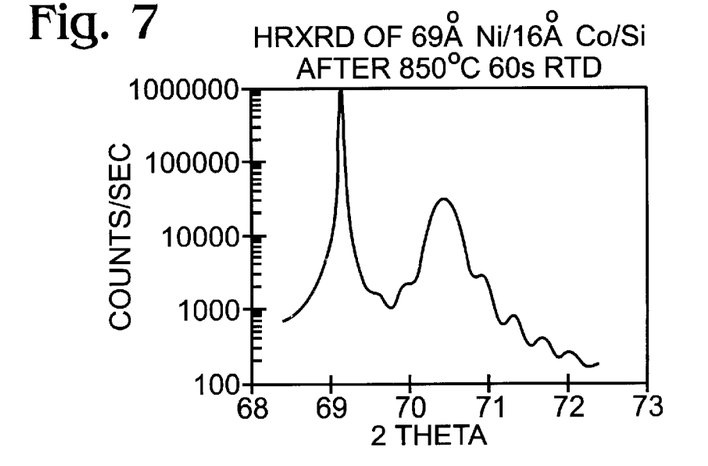
FIG. 7 shows a high resolution X-ray diffraction pattern of a nickel silicide film with cobalt addition after annealing at 850° C. for sixty seconds.

FIG. 7 shows a high resolution X-ray diffraction pattern of a nickel silicide film with cobalt addition after annealing at 850° C. for sixty seconds. In FIG. 7, the ordinate represents counts/second and the abscissa represents 2Theta. The deposited film comprised a cobalt layer on the silicon substrate, wherein the thickness of the cobalt layer was 16 Å. A nickel layer having a thickness of 69 Å was deposited on the cobalt layer. These two layers were then subject to annealing at 850° C. for sixty seconds to form the nickel silicide film. As shown in the HRXRD pattern, the nickel silicide film shows improved film crystalline properties over prior art films for annealing temperatures greater than 700° C. In particular, the figure shows that the disilicide is of high quality and the interface between the silicide and the Si is relatively smooth. At lower annealing temperatures single crystal films were also detected, as shown in FIGS. 5 and 6. However, the film crystalline properties of those films are not as high as the properties of the film shown in FIG. 7. In particular, the peak at a 2Theta of approximately 70 is approximately 4,000 counts per second in FIG. 5, approximately 10,000 counts per second in FIG. 6, and approximately 30,000 counts per second in FIG. 7.

Further X-ray diffraction results show that in order to provide a device having improved crystalline quality, the cobalt interlayer preferably is provided at the nickel-silicon interface. In another embodiment, the cobalt may be provided within the nickel film itself. If the Co is positioned in the middle of the Ni film, Applicants have found that the crystalline quality is not as good as in films where the cobalt is deposited at the silicon interface, but such films still have improved crystalline quality compared to prior art nickel silicide films fabricated without a cobalt interlayer. In particular, these results are demonstrated by the following figures showing the silicide sheet resistance change with annealing temperature.

Figure 8:
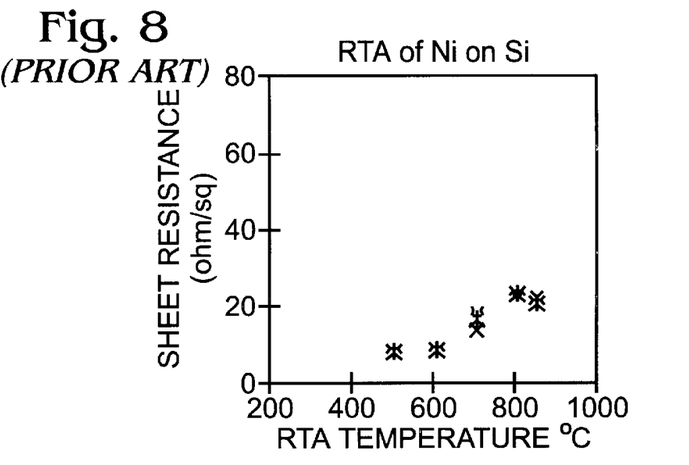
FIG. 8 shows a sheet resistance of a nickel silicide formed from a prior art nickel film wherein the sheet resistance increases at temperatures greater than approximately 600° C.

FIG. 8 shows the sheet resistance of a nickel silicide formed from a prior art nickel film, fabricated without a cobalt interlayer, wherein the sheet resistance increases at annealing temperatures greater than approximately 600° C. The silicide was formed from a nickel film having a thickness of 85 Å, positioned on the silicon substrate. In this figure the ordinate represents the sheet resistance in ohm/square and the abscissa represents the rapid thermal annealing (RTA) temperature in degrees Celsius.

Figure 9:
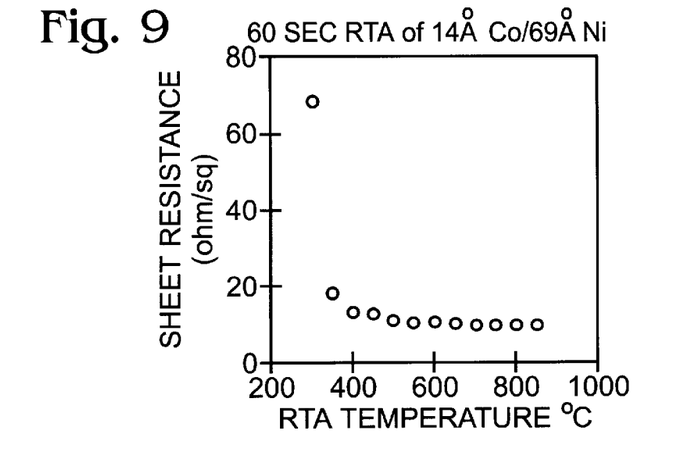
FIG. 9 shows a sheet resistance of a nickel silicide formed from a nickel film with cobalt at the nickel-silicon interface wherein the sheet resistance decreases with annealing temperature.

FIG. 9 shows the sheet resistance of a nickel silicide film fabricated from a nickel film with cobalt positioned at the nickel-silicon interface wherein the sheet resistance decreases with the anneal temperature. The silicide was formed from a cobalt film having a thickness of 14 Å deposited on the silicon substrate, and a nickel film having a thickness of 69 Å subsequently deposited on the cobalt film. The films were then subjected to annealing. The thermal stability of this device is improved over the prior art. In particular, the sheet resistance decreases with annealing temperatures of approximately 400° C. or greater, and remains low at annealing temperatures of 850° C. and greater. In this figure the ordinate represents the sheet resistance in ohm/square and the abscissa represents the rapid thermal annealing (RTA) temperature in degrees Celsius.

Figure 10:
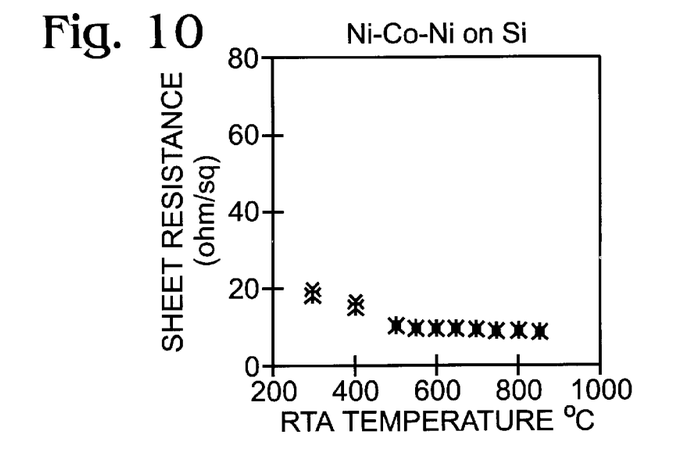
FIG. 10 shows a sheet resistance of a nickel silicide formed from a nickel film having a cobalt layer sandwiched between two nickel layers wherein the sheet resistance decreases with annealing temperature.

FIG. 10 shows the sheet resistance of a nickel silicide film fabricated from a cobalt layer sandwiched between two nickel layers wherein the sheet resistance decreases with the anneal temperature. The silicide was formed from a first nickel film having a thickness of approximately 40 Å deposited on the silicon substrate, a cobalt film having a thickness of 16 Å deposited on the first nickel film, and a second nickel film having a thickness of approximately 29 Å deposited on the silicon substrate. The films were then subjected to annealing for approximately sixty seconds. The thermal stability of this film is also improved over the prior art. In particular, the sheet resistance decreases with annealing temperatures of approximately 500° C. or greater, and remains low at annealing temperatures of 850° C. and greater. In this figure the ordinate represents the sheet resistance in ohm/square and the abscissa represents the rapid thermal annealing (RTA) temperature in degrees Celsius. Adding cobalt in the middle of the nickel film improves the film stability, but does not appear to improve the film's crystallinity. Accordingly, a cobalt film positioned at the silicon interface is the preferred method of the present invention.

Figure 11:
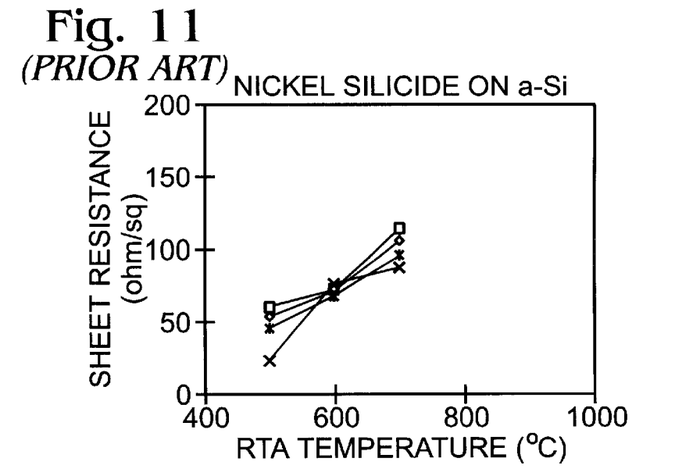
FIG. 11 shows sheet resistance changes with annealing temperature for prior art nickel films deposited on amorphous silicon without a cobalt interlayer.
Figure 12:
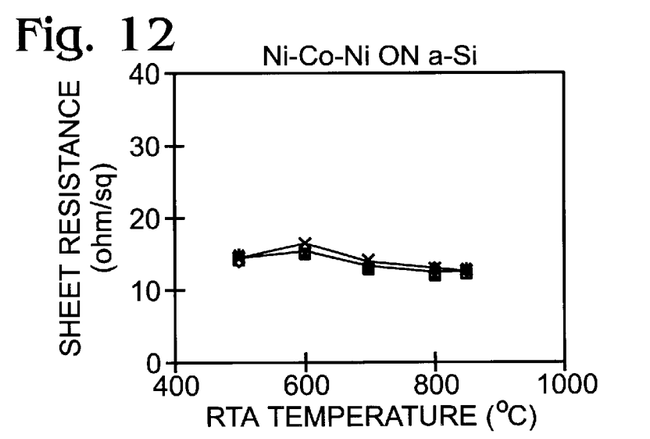
FIG. 12 shows silicide sheet resistance changes with annealing temperature for a film comprising cobalt sandwiched between two nickel films on amorphous silicon.
Figure 13:
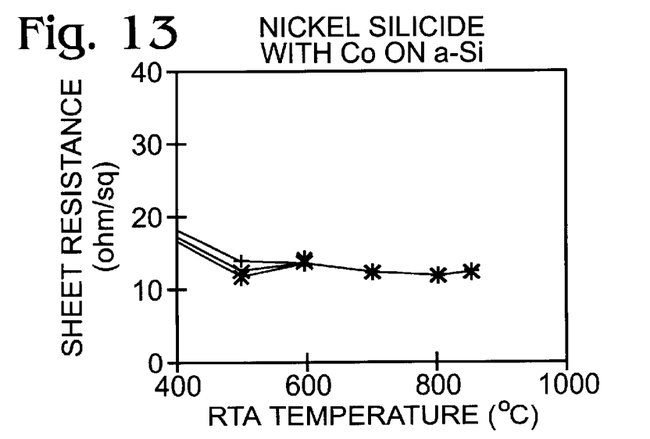
FIG. 13 shows silicide sheet resistance changes with annealing temperature for a film comprising cobalt at the nickel-silicon interface on amorphous silicon.

The present invention provides a nickel silicide, and a method of fabricating the same, that is applicable to and stable for use on amorphous silicon. In FIGS. 11 through 13 the amorphous Si was deposited on a thermal oxide by low pressure chemical vapor deposition (LPCVD). The results show that the thermal stability of prior art nickel silicides on amorphous Si, without the use of a cobalt interlayer during fabrication, is very poor. In particular, a significant increase in sheet resistance is detected even at annealing temperatures of 600° C. However, thermal stability of nickel silicides is much improved with the addition of a cobalt interlayer of the present invention.

FIG. 11 shows sheet resistance changes with annealing temperature for prior art nickel films deposited on amorphous silicon without a cobalt interlayer. A significant increase in the sheet resistance is detected at temperatures of approximately 600° C. and greater. In this figure the ordinate represents the sheet resistance in ohm/square and the abscissa represents the rapid thermal annealing (RTA) temperature in degrees Celsius.

FIG. 12 shows silicide sheet resistance changes with anneal temperature for a film comprising cobalt sandwiched between two nickel films. A decrease in the sheet resistance is detected at temperatures of approximately 600° C. and greater. Moreover, the sheet resistance detected, on the order of 12 ohm/square, is much lower than the sheet resistances of approximately 100 ohm/square as shown in FIG. 11 for the prior art silicide films. In FIG. 12 the ordinate represents the sheet resistance in ohm/square and the abscissa represents the rapid thermal annealing (RTA) temperature in degrees Celsius.

FIG. 13 shows silicide sheet resistance changes with anneal temperature for a film comprising cobalt positioned at the nickel silicon interface on amorphous silicon. A decrease in the sheet resistance is detected at temperatures of approximately 600° C. and greater. Moreover, the sheet resistance detected, on the order of 12 ohm/square, is much lower than the sheet resistance of approximately 100 ohm/square as shown in FIG. 11 for the prior art silicide films. In this figure the ordinate represents the sheet resistance in ohm/square and the abscissa represents the rapid thermal annealing (RTA) temperature in degrees Celsius.

The nickel silicide film of the present invention, and the method of fabricating the same, is applicable for use in ultra-shallow junctions. Ultra-shallow junctions, having a junction depth of approximately 40 nm or less, were formed by a plasma doping technique. N+/P junctions were formed using a gas mixture of $PH_3$/He. P+/N junctions were formed using a gas mixture of $B_2H_6$/He. Activation was achieved by a two-step RTA anneal where recrystallization was performed at approximately 800° C., followed by a spike anneal at approximately 1050° C. The junction depths, as determined by secondary ion mass spectrometry (SIMS) were about 40 nm. Nickel and cobalt were deposited by sequential e-beam evaporation. The thickness of the Co film deposited was in the range of 14 Å to 20 Å. The Ni film thickness was in the range of 25 Å to 130 Å. The silicide was then formed by a RTA anneal, typically at 550° C. The distributions shown in FIGS. 14 to 17 are reverse bias junction leakages measured on ultra-shallow junctions after silicide formation in 100 $\mu$m×100 $\mu$m areas at |3V|.

Figure 14:
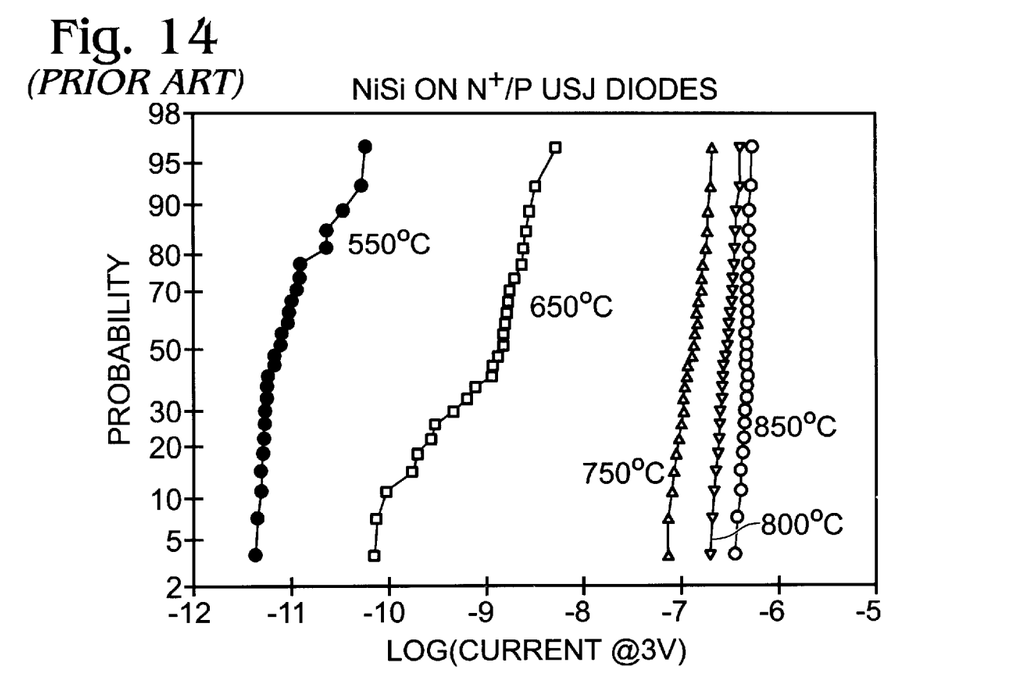
FIG. 14 shows reverse bias junction leakage measured on prior art ultra-shallow junctions after nickel silicide formation without a cobalt interlayer for N+/P junctions wherein an increase in current with rising annealing temperatures is observed.

FIG. 14 shows prior art reverse bias junction leakage distributions measured on ultra-shallow junctions after nickel silicide formation for N+/P diode junctions wherein an increase in current with rising annealing temperatures is observed. The silicide was formed from a nickel film having a thickness of approximately 68 Å. The RTA step was performed consecutively at 550° C., 650° C., 750° C., 800° C. and 850° C., each for 60 seconds. Significant increases in the current with the RTA temperature are observed.

Figure 15:
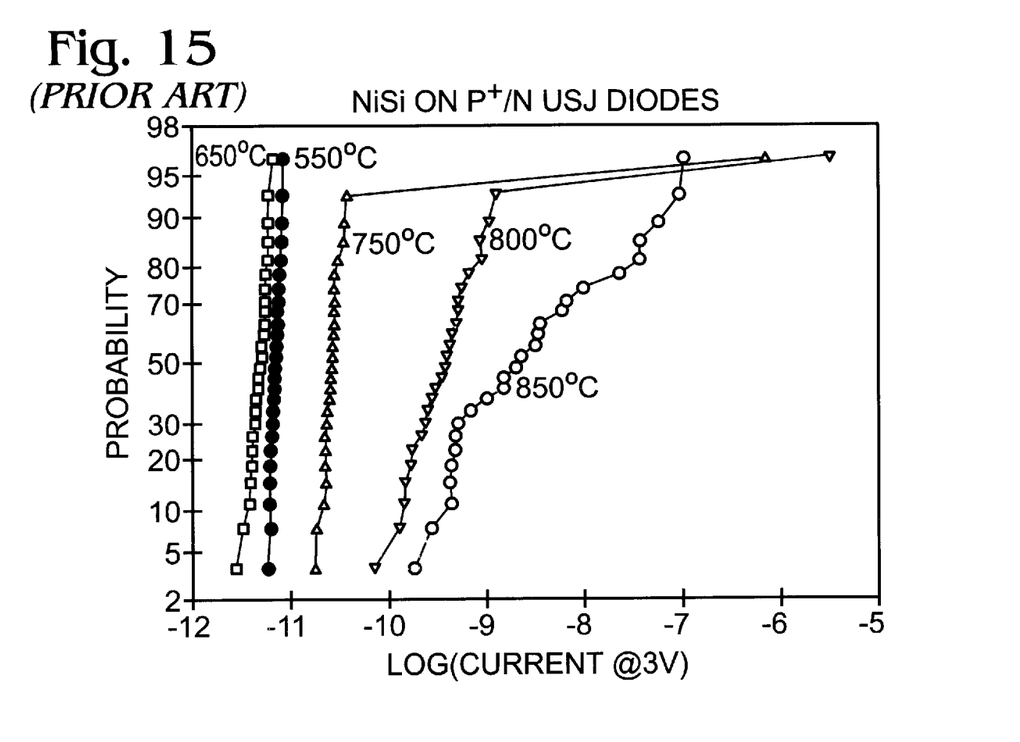
FIG. 15 shows prior art reverse bias junction leakage measured on ultra-shallow junctions after nickel silicide formation without a cobalt interlayer for P+/N junctions wherein an increase in current with rising annealing temperatures is observed.

FIG. 15 shows prior art reverse bias junction leakage distributions measured on ultra-shallow junctions after nickel silicide formation for P+/N diode junctions wherein an increase in current with rising annealing temperatures is observed. The silicide was formed from a nickel film having a thickness of approximately 68 Å. The RTA step was performed consecutively at 550° C., 650° C., 750° C., 800° C. and 850° C., each for 60 seconds. Significant increases in the current with the RTA temperature are observed.

Figure 16:
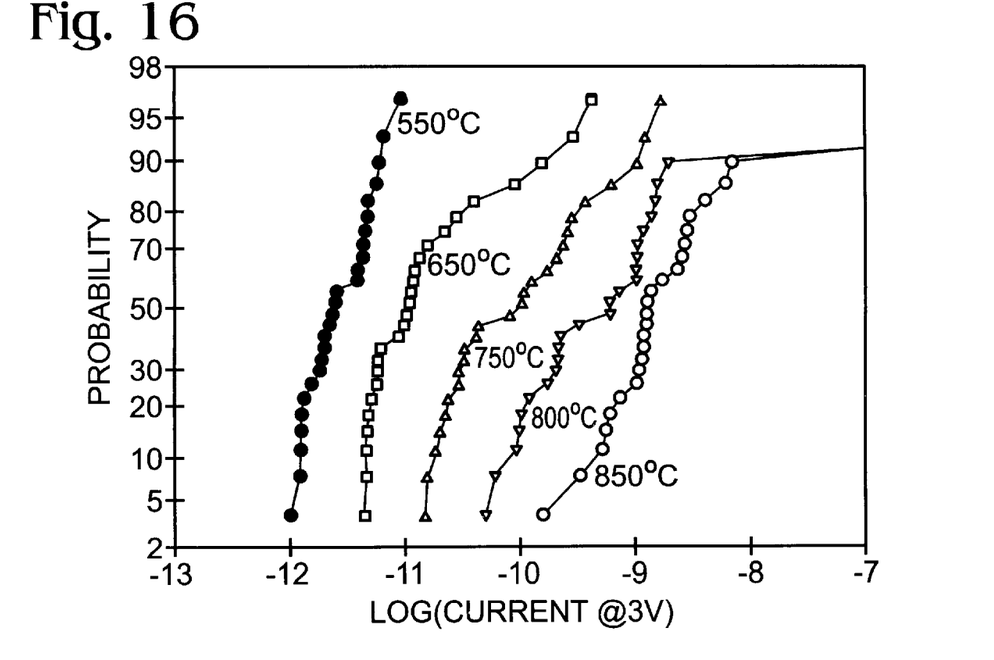
FIG. 16 shows reverse bias junction leakage measured on ultra-shallow N+/P junctions wherein the nickel silicide was formed from sequentially deposited cobalt and nickel films, and wherein the film shows low leakage up to 850° C.

FIG. 16 shows reverse bias junction leakage measured on ultra-shallow N+/P junctions wherein the nickel silicide was formed from sequentially deposited cobalt and nickel films on a silicon substrate, and wherein the film shows low leakage up to 850° C. The cobalt film had a thickness of approximately 14 to 16 Å and was deposited at the silicon interface. The Ni film thickness was approximately 69 Å, and was deposited on the cobalt film. The device was then annealed. The RTA step was performed consecutively at 550° C., 650° C., 750° C., 800° C. and 850° C., each for 60 seconds. The sheet resistance remained under about 9 ohm/square even after a 30 min anneal at 850° C. The sheet resistance showed gradual rising values but there is a three order of magnitude improvement from the prior art devices manufactured with silicide and nickel only, and without a cobalt interlayer.

Figure 17:
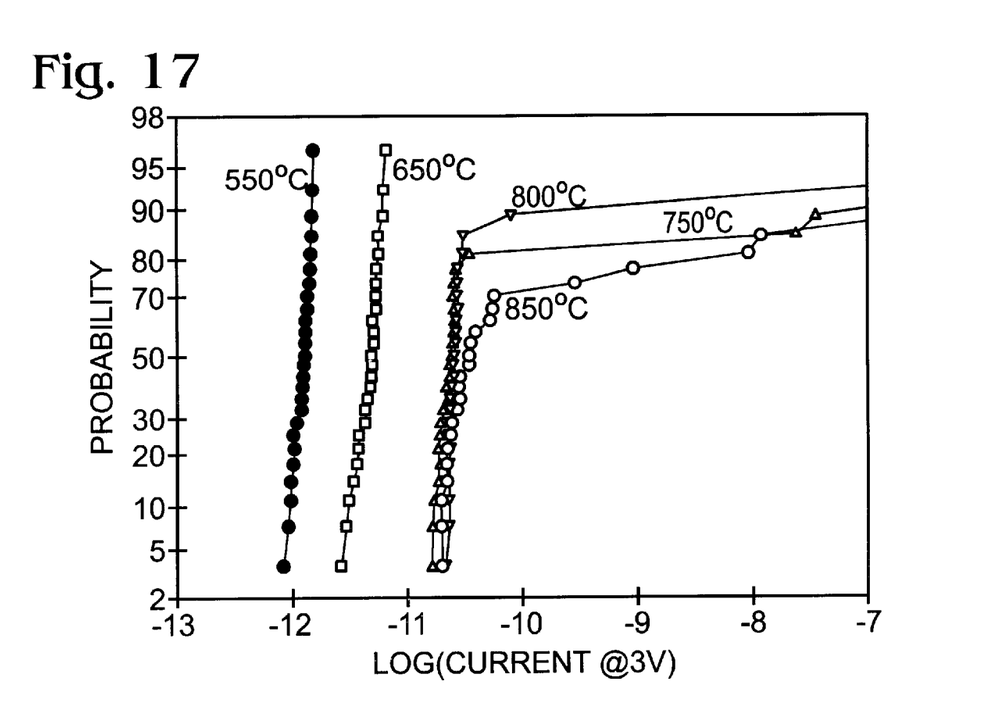
FIG. 17 shows reverse bias junction leakage measured on ultra-shallow P+/N junctions wherein the nickel silicide was formed from sequentially deposited cobalt and nickel films, and wherein the film shows decreased leakage compared to prior art nickel silicide films formed without a cobalt interlayer.

FIG. 17 shows reverse bias junction leakage measured on ultra-shallow P+/N junctions wherein the nickel silicide was formed from sequentially deposited cobalt and nickel films, and wherein the film shows decreased leakage compared to prior art nickel silicide films. The cobalt film had a thickness of approximately 14 to 16 Å and was deposited at the silicon interface. The Ni film thickness was approximately 69 Å, and was deposited on the cobalt film. The films were then annealed. The RTA step was performed consecutively at 550° C., 650° C., 750° C., 800° C. and 850° C., each for 60 seconds. The sheet resistance remained under about 9 ohm/square even after a 30 min anneal at 850° C. Low leakage was demonstrated for the P+/N junctions up to approximately 850° C.

Figure 18:
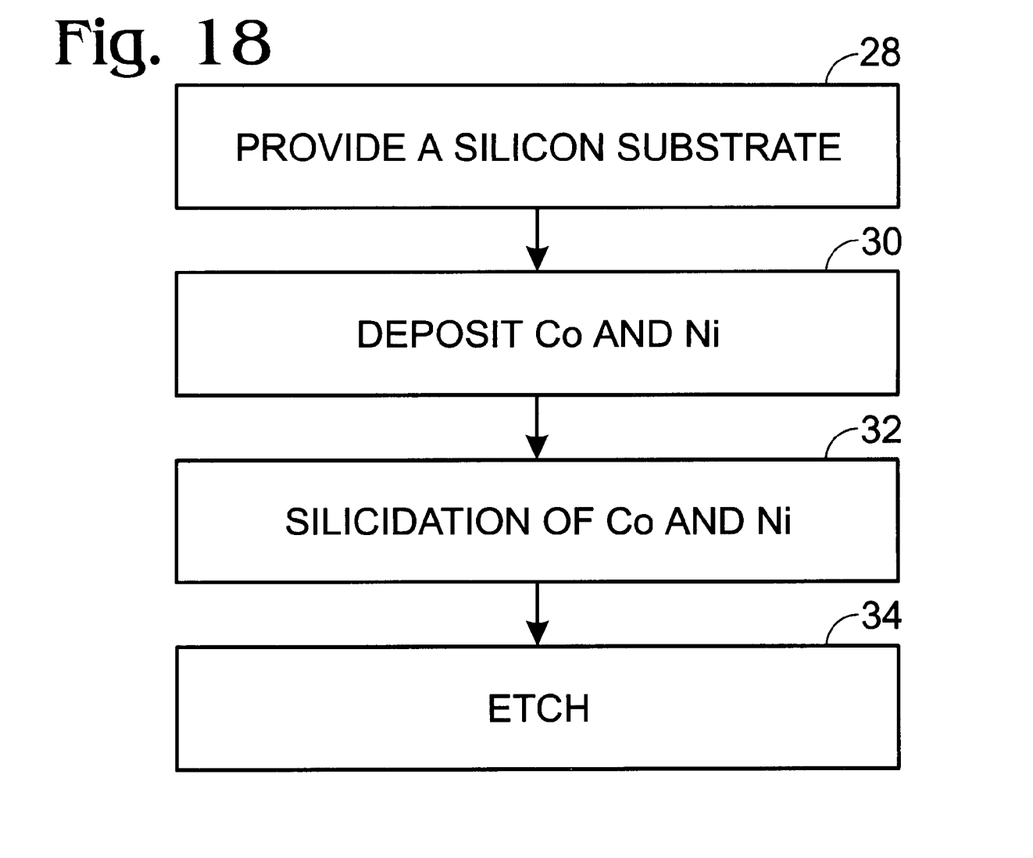
FIG. 18 is a flowchart of the method of the present invention.

FIG. 18 is a flowchart of the fabrication method of the present invention. In particular, step 28 comprises providing a silicon substrate. The silicon substrate may comprise an amorphous silicon substrate or a (100) oriented silicon substrate.

Step 30 comprises depositing cobalt and nickel on the amorphous silicon or on the (100) silicon substrate. In one embodiment, deposition of the nickel and the cobalt comprises depositing a Co film and a Ni film on the source, drain and polysilicon areas of a device by physical vapor deposition including sputtering and evaporation, or by chemical vapor deposition including metalorganic chemical vapor deposition. In particular, in this embodiment, step 30 comprises depositing a Co film on the silicon and then depositing a Ni film on the cobalt film. The thickness of the cobalt layer typically is in a range of 5 to 20 Å. The thickness of the Ni layer typically is in the range of 50 to 200 Å. In another embodiment, deposition of the cobalt and the nickel may comprise co-sputtering or co-evaporation of the cobalt and the nickel, or sputtering from a Ni—Co target, to form a Co—Ni film. The atomic percentage of the Co in the Ni typically is in the range of 2% to 15%. In yet another embodiment, step 30 comprises creating a sandwich structure with a layer of Co in the middle of two Ni layers. In this embodiment, a first nickel layer is deposited on the silicon, a cobalt layer is deposited on the first nickel layer, and a second nickel layer is deposited on the cobalt layer. In one example of this embodiment, a first nickel layer having a thickness of approximately 40 Å is deposited on the silicon substrate, a cobalt film having a thickness of 16 Å is deposited on the first nickel film, and a second nickel film having a thickness of approximately 29 Å is deposited on the silicon substrate.

Step 32 comprises silicidation of the cobalt and nickel on the silicon layer. The silicidation step typically is performed in an inert ambient or nitrogen ambient, at a temperature in the range of 300° C. to 900° C. for a period of 10 sec to two minutes. Single-crystal nickel disilicide on the amorphous or (100) silicon, with very good crystal perfection, can be achieved at 850° C. This step results in a nickel silicide layer having cobalt incorporated therein. In other words, the nickel disilicide and the cobalt disilicide are miscible. Both the nickel disilicide and the cobalt disilicide have similar crystal structures so that the two disilicides from a high quality crystal on (100) silicon. The nickel silicide layer formed typically has a thickness in a range of 90 to 700 Angstroms and a cobalt atomic percentage in a range of two to fifteen percent.

The method of the present invention typically comprises a rapid thermal anneal step conducted at a temperature in a range of 300 to 700 degrees Celsius for a time period in a range of ten seconds to two minutes. When the rapid thermal anneal step is conducted at a temperature lower than 600 degrees Celsius, than a second annealing step to anneal the silicide film is conducted. The second annealing step, which typically is conducted after etching of the film in a Piranha solution, is conducted at a temperature of at least 600 degrees Celsius for a time period in a range of ten seconds to two minutes.

Step 34 comprises conducting a selective etch, typically conducted in a Piranha solution which consists of sulfuric acid and hydrogen peroxide. The etch temperature typically is between 75° C. and 150° C.

A specific example of one process is given below. First, a pre-metal dip of a wafer in a dilute buffered HF solution is conducted for 20 seconds. Second, the wafer is rinsed in de-ionized water and spun dry before being loaded into an e-beam evaporation chamber. The wafer used is a patternless p-type (100) silicon wafer. Third, a 15 Å thick Co film is deposited by evaporation or sputtering on the wafer. Fourth, a 75 Å thick Ni film is deposited by evaporation or sputtering on the cobalt film. Fifth, a RTA anneal in Argon is conducted on the wafer including the nickel and cobalt films, at 350 to 500° C. for 60 seconds to form a nickel silicide on the wafer, having cobalt complexed therein. Sixth, a selective etch in a Piranha solution is performed on the nickel silicide formed on the wafer. Seventh, the wafer is subjected to further annealing at 600 to 850° C. to convert the nickel silicide to single-crystal nickel disilicide with good crystal perfection. The sheet resistance is determined by use of a four-point probe. The film structure is analyzed by use of a Phillips Analytical x-ray diffraction system in a high resolution mode and by cross-sectional transmission electron miscroscopy. The layer composition is analyzed by Rutherford backscattering analysis.

In summary, a significant improvement in the thermal stability of nickel silicide is achieved by adding cobalt at the nickel/silicon interface. This process appears to be very useful for the fabrication of proposed future devices having ultra-shallow junctions. The reason for the improved thermal stability and low junction leakage is due to an ultra-smooth interface, demonstrated by high resolution X-ray diffraction.

Thus, a method of producing an improved nickel silicide device, and a device incorporating the same, has been disclosed. Although preferred structures and methods of fabricating the device have been disclosed, it should be appreciated that further variations and modifications may be made thereto without departing from the scope of the invention as defined in the appended claims.

We claim:

1. A microelectronic device comprising:
a silicon substrate; and
a nickel silicide positioned on said silicon substrate, wherein said nickel silicide includes cobalt therein, and wherein said cobalt comprises a cobalt atomic percentage in a range of two to fifteen percent in said nickel silicide.

2. The device of claim 1 wherein said device is a junction chosen from the group consisting of a P+/N junction and a N+/P junction.

3. The device of claim 1 wherein said device has a sheet resistance of no more than nine ohm/square, as measured across an area of 100 $\mu$m×100 $\mu$m at |3V|, after annealing of the device for at least thirty minutes at a temperature of at least 600 degrees Celsius.

4. The device of claim 1 wherein said nickel silicide has a thickness in a range of 90 to 700 Angstroms.

5. The device of claim 1 wherein said nickel silicide is stable at temperatures greater than 700 degrees Celsius during annealing of said device for a time period of ten seconds to two minutes.

6. The device of claim 1 wherein said nickel silicide comprises single-crystal nickel disilicide having an absence of faceting along a (111) plane into said silicon substrate.

7. The device of claim 1 wherein said silicon substrate is an amorphous silicon substrate.

8. The device of claim 2 wherein said junction has a depth of at most 100 nm.

9. The device of claim 1 wherein said silicon substrate is a (100) silicon substrate.

* * * * *